US012765245B2

(12) United States Patent
Roh

(10) Patent No.: US 12,765,245 B2
(45) Date of Patent: Oct. 13, 2026

(54) DISPLAY DEVICE

(71) Applicant: LG Display Co., Ltd., Seoul (KR)

(72) Inventor: ByeongGyu Roh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 444 days.

(21) Appl. No.: 18/449,432

(22) Filed: Aug. 14, 2023

(65) Prior Publication Data

US 2024/0074295 A1 Feb. 29, 2024

(30) Foreign Application Priority Data

Aug. 31, 2022 (KR) ........................ 10-2022-0110293

(51) Int. Cl.
*H10K 59/80* (2023.01)
*H10K 59/122* (2023.01)
*H10K 59/40* (2023.01)

(52) U.S. Cl.
CPC ....... *H10K 59/8791* (2023.02); *H10K 59/122* (2023.02); *H10K 59/873* (2023.02); *H10K 59/40* (2023.02)

(58) Field of Classification Search
CPC ............. H10K 59/8791; H10K 59/122; H10K 59/873; H10K 59/40; H10K 59/12;
(Continued)

(56) References Cited

U.S. PATENT DOCUMENTS 11,038,151 B2 6/2021 Ju et al.
2008/0042926 A1 2/2008 Egi et al.
(Continued)

FOREIGN PATENT DOCUMENTS

CN 111384281 A 7/2020
KR 10-2016-0032970 A 3/2016
(Continued)

OTHER PUBLICATIONS

European Patent Office, Extended European Search Report, European Patent Application No. 23191201.5, Feb. 1, 2024, eight pages.
(Continued)

*Primary Examiner* — Elmito Breval
(74) *Attorney, Agent, or Firm* — Fenwick & West LLP

(57) ABSTRACT

A display device according to an exemplary embodiment of the present disclosure includes a substrate having an active area in which a plurality of sub-pixels is defined, and a non-active area. Also, the display device includes a light emitting diode disposed in each of the plurality of sub-pixels. Further, the display device includes a primary protection film disposed on the substrate on which the light emitting diodes are disposed, and including a plurality of trenches in its surface. Furthermore, the display device includes an organic film deposited on the primary protection film along an inner contour shape of the trenches through a vapor deposition process. Also, the display device includes a secondary protection film disposed on the organic film. Accordingly, reflection of external light is suppressed. Thus, it is possible to improve visibility and enhance display quality. Therefore, it is possible to enhance privacy in displaying information.

25 Claims, 16 Drawing Sheets

(58) Field of Classification Search
CPC .. H10K 50/844; H10K 50/8426; H10K 50/86; H10K 59/124; H10K 59/38
See application file for complete search history.

(56) References Cited

U.S. PATENT DOCUMENTS

| | | | | |
|---|---|---|---|---|
| 2020/0243611 | A1* | 7/2020 | Kato | H10K 59/8731 |
| 2020/0243802 | A1 | 7/2020 | Ju et al. | |

FOREIGN PATENT DOCUMENTS

| | | | |
|---|---|---|---|
| KR | 10-2017-0035698 | A | 3/2017 |
| KR | 10-2020-0092533 | A | 8/2020 |

OTHER PUBLICATIONS

Ministry of Intellectual Property of Korea, Office Action, Korean Patent Application No. 10-2022-0110293, Jan. 8, 2026, seven pages.

* cited by examiner

DISPLAY DEVICE

CROSS-REFERENCE TO RELATED APPLICATIONS

This application claims the priority of Republic of Korea Patent Application No. 10-2022-0110293 filed on Aug. 31, 2022, which is hereby incorporated by reference in its entirety.

BACKGROUND

Field

The present disclosure relates to a display device, and more particularly, to a display device which may suppress reflection of external light.

Description of the Related Art

As an information age enters, the field of display devices for visually displaying electrical information signals is rapidly developing. Thus, studies for improving performance such as thinning, weight reduction, and low power consumption have continued.

An organic light emitting display device among various display devices is a self-emitting display device and does not require a separate light source unlike a liquid crystal display device. Thus, the organic light emitting display device may be manufactured in a lightweight and thin form. Further, the organic light emitting display device is not only advantageous in terms of power consumption by low voltage driving, but also has excellent color expression ability, response speed, viewing angle and contrast ratio (CR). Therefore, the organic light emitting display device has received attention as the next-generation display device.

SUMMARY

An object to be achieved by the present disclosure is to provide a display device which may suppress reflection of external light.

Another object to be achieved by the present disclosure is to provide a display device with enhanced moisture barrier properties.

Objects of the present disclosure are not limited to the above-mentioned objects, and other objects, which are not mentioned above, can be clearly understood by those skilled in the art from the following descriptions.

According to an aspect of the present disclosure, the display device includes a substrate having an active area in which a plurality of sub-pixels is defined, and a non-active area. Also, the display device includes a light emitting diode disposed in each of the plurality of sub-pixels. Further, the display device includes a primary protection film disposed on the substrate on which the light emitting diodes are disposed, and including a plurality of trenches in its surface. Furthermore, the display device includes an organic film deposited on the primary protection film along an inner contour shape of the trenches through a vapor deposition process. Also, the display device includes a secondary protection film disposed on the organic film.

According to another aspect of the present disclosure, the display device includes a substrate divided into an active area and a non-active area. Also, the display device includes a plurality of light emitting diodes disposed in the active area, and an encapsulation layer composed of at least three films laminated on the substrate on which the light emitting diodes are disposed. A lowermost layer of the encapsulation layer includes a plurality of trenches in its surface. The plurality of trenches may extend to the non-active area via the active area.

Other detailed matters of the exemplary embodiments are included in the detailed description and the drawings.

According to the present disclosure, reflection of external light is suppressed. Thus, it is possible to improve visibility and enhance display quality. Therefore, it is possible to enhance privacy in displaying information.

According to the present disclosure, moisture barrier properties are enhanced. Thus, it is possible to improve the reliability of a display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
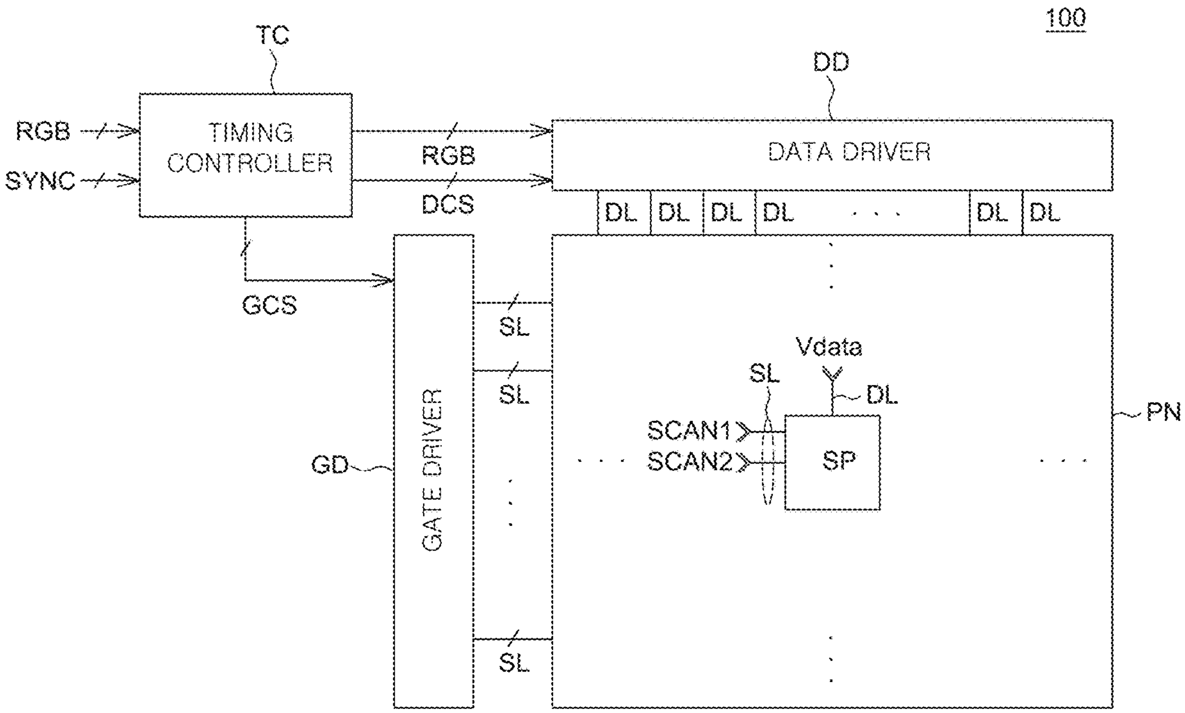
FIG. 1 is a schematic configuration diagram of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic configuration diagram of a display device according to a first exemplary embodiment of the present disclosure.

Referring to FIG. 1, a display device 100 may include a display panel PN including a plurality of sub-pixels SP, and a gate driver GD and a data driver DD. Also, the display device 100 may include a timing controller TC for controlling the data driver DD and the gate driver GD.

The gate driver GD may supply a plurality of scan signals to a plurality of scan lines SL in response to a plurality of gate control signals GCS supplied from the timing controller TC. The plurality of scan signals includes first and second scan signals SCAN1 and SCAN2.

The data driver DD may convert image data RGB input from the timing controller TC into a data signal Vdata using a reference gamma voltage in response to a plurality of data control signals DCS supplied from the timing controller TC. Further, the data driver DD may supply the converted data signal Vdata to a plurality of data lines DL.

The timing controller TC may align the image data RGB input from the outside and then supply the image data RGB to the data driver DD. Also, the timing controller TC may generate a gate control signal GCS and a data control signal DCS by using a synchronization signal SYNC input from the outside.

Figure 2:
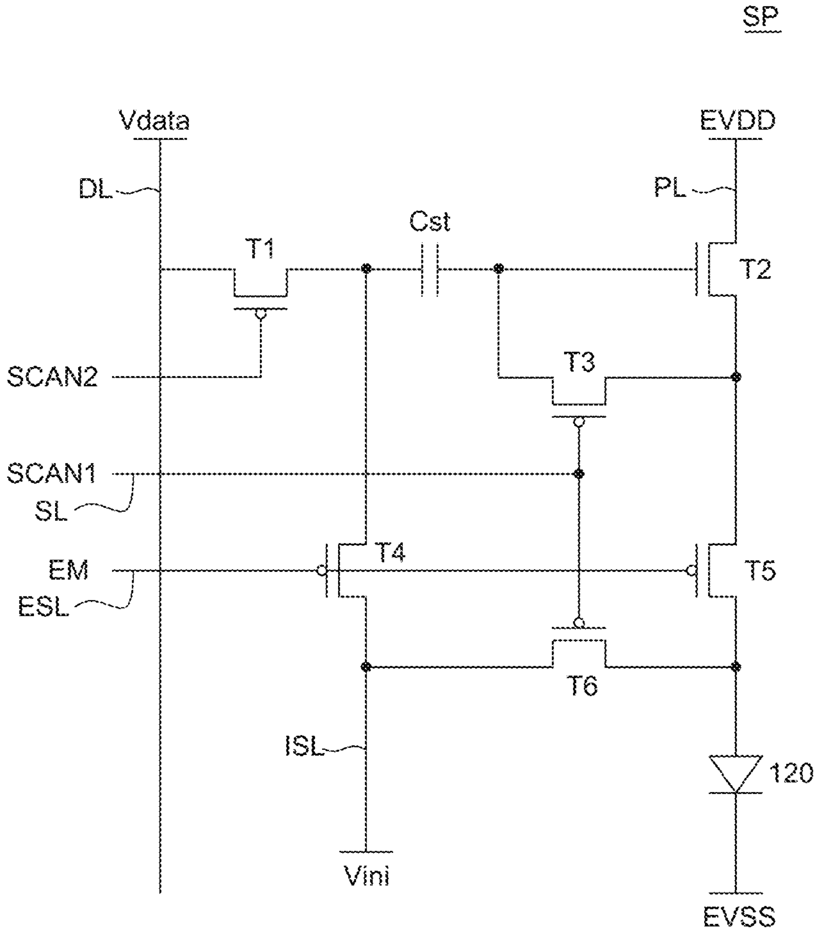
FIG. 2 is a circuit diagram of a sub-pixel of the display device of FIG. 1 according to an exemplary embodiment of the present disclosure.

FIG. 2 is a circuit diagram of a sub-pixel of the display device of FIG. 1 according to one embodiment.

Referring to FIG. 2, a pixel circuit for each of the plurality of sub-pixels SP may include first to sixth transistors T1, T2, T3, T4, T5 and T6, and a capacitor Cst.

A first transistor T1 may be connected to a second scan line and controlled by a second scan signal SCAN2 supplied through a second scan line. The first transistor T1 may be electrically connected between the capacitor Cst and a data line that supplies the data signal Vdata.

A second transistor T2 may be electrically connected between the fifth transistor T5 and a high potential power line that supplies a high potential power signal EVDD. Further, a gate electrode of the second transistor T2 may be electrically connected to the capacitor Cst.

Also, the third transistor T3 may be controlled by a first scan signal SCANT supplied through a first scan line, and may compensate for a threshold voltage of the second transistor T2. The third transistor T3 may be referred to as a compensation transistor.

A fourth transistor T4 may be electrically connected between the capacitor Cst and an initialization signal line that supplies an initialization signal Vini. Further, the fourth transistor T4 may be controlled by an emission control signal EM supplied through an emission control signal line.

Further, a fifth transistor T5 may be electrically connected between the second transistor T2 and a light emitting diode 120 and controlled by the emission control signal EM supplied through the emission control signal line.

A sixth transistor T6 may be electrically connected between the initialization signal line that supplies the initialization signal Vini and an anode of the light emitting diode 120. Also, the sixth transistor T6 may be controlled by the first scan signal SCAN1 supplied through the first scan line.

Herein, the pixel circuit for each of the plurality of sub-pixels SP has been described as including the first to sixth transistors T1, T2, T3, T4, T5 and T6, and the capacitor Cst. However, as described above, the present disclosure is not limited thereto.

Hereinafter, a pixel structure of the display device according to the first exemplary embodiment of the present disclosure will be described in more detail with reference to FIG. 3A, FIG. 3B through FIG. 5.

Figure 3A:
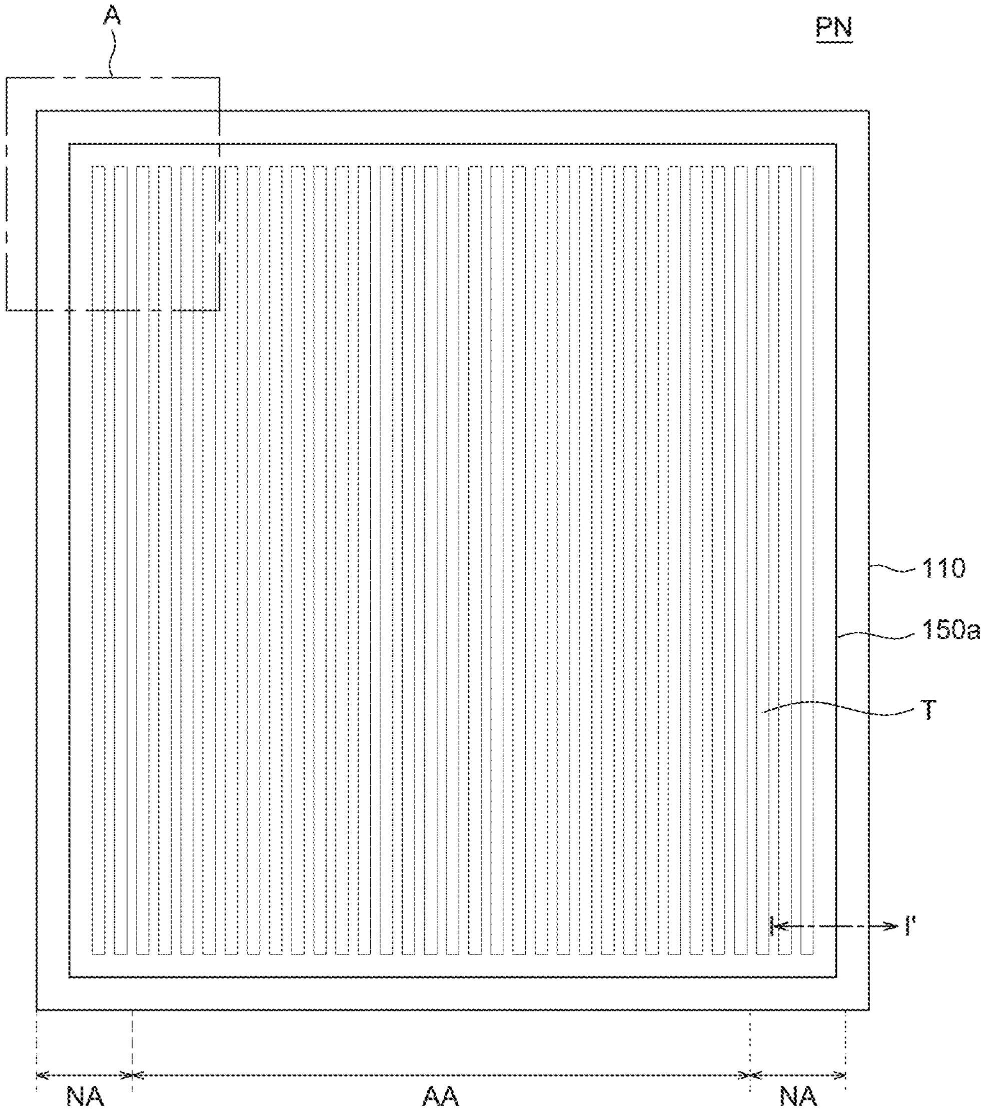
FIG. 3A is a plan view schematically illustrating the display panel of FIG. 1 according to an exemplary embodiment of the present disclosure.

FIG. 3A is a plan view schematically illustrating the display panel of FIG. 1 according to one embodiment.

Figure 3B:
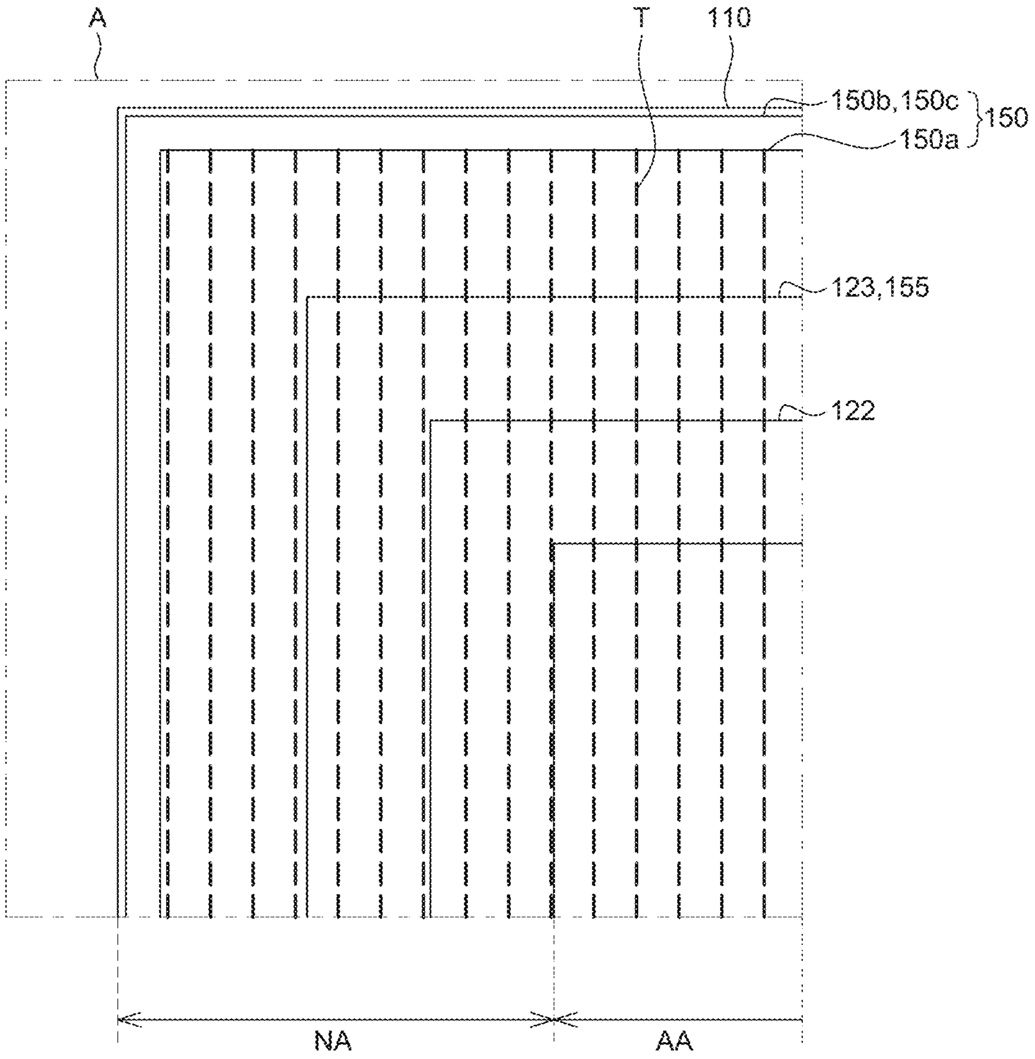
FIG. 3B is an enlarged view showing a portion A of FIG. 3A according to an exemplary embodiment of the present disclosure.

FIG. 3B is an enlarged view showing a portion A of FIG. 3A according to one embodiment.

Figure 4:
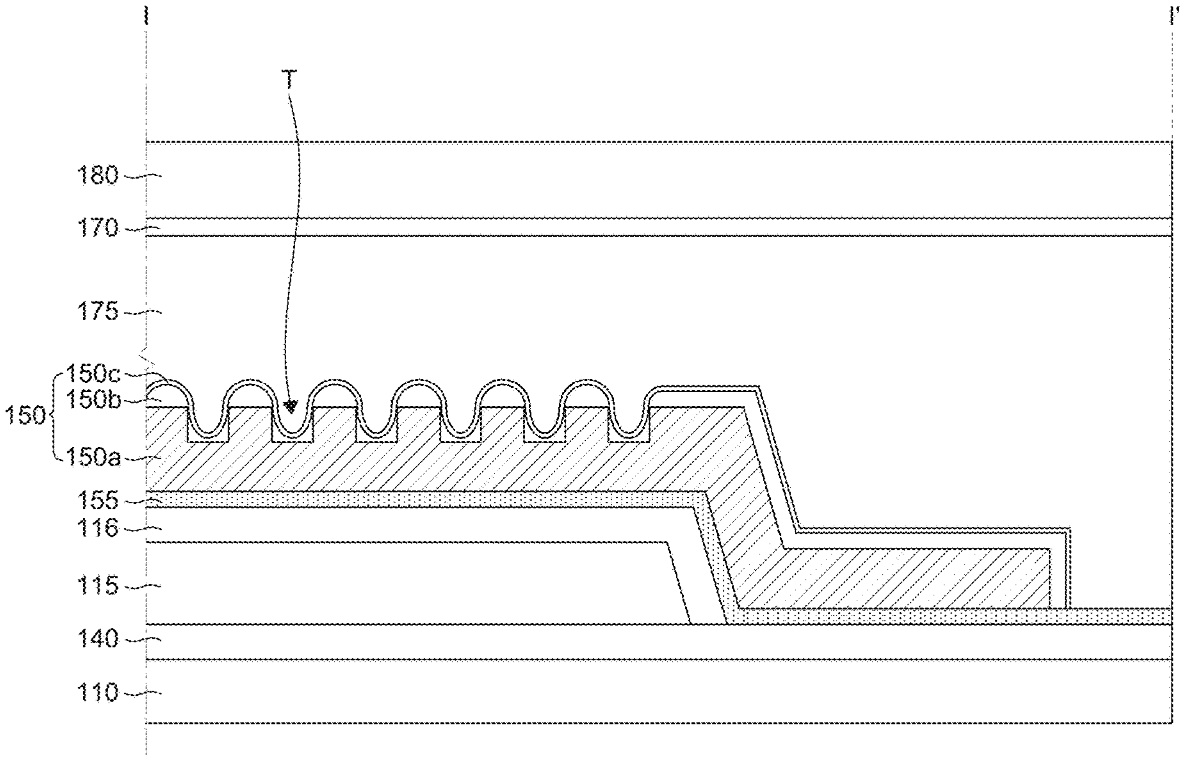
FIG. 4 is a cross-sectional view as taken along a line I-I' of the display panel shown in FIG. 3A according to an exemplary embodiment of the present disclosure.

FIG. 4 is a cross-sectional view as taken along a line I-I' of the display panel shown in FIG. 3A according to one embodiment.

Figure 5:
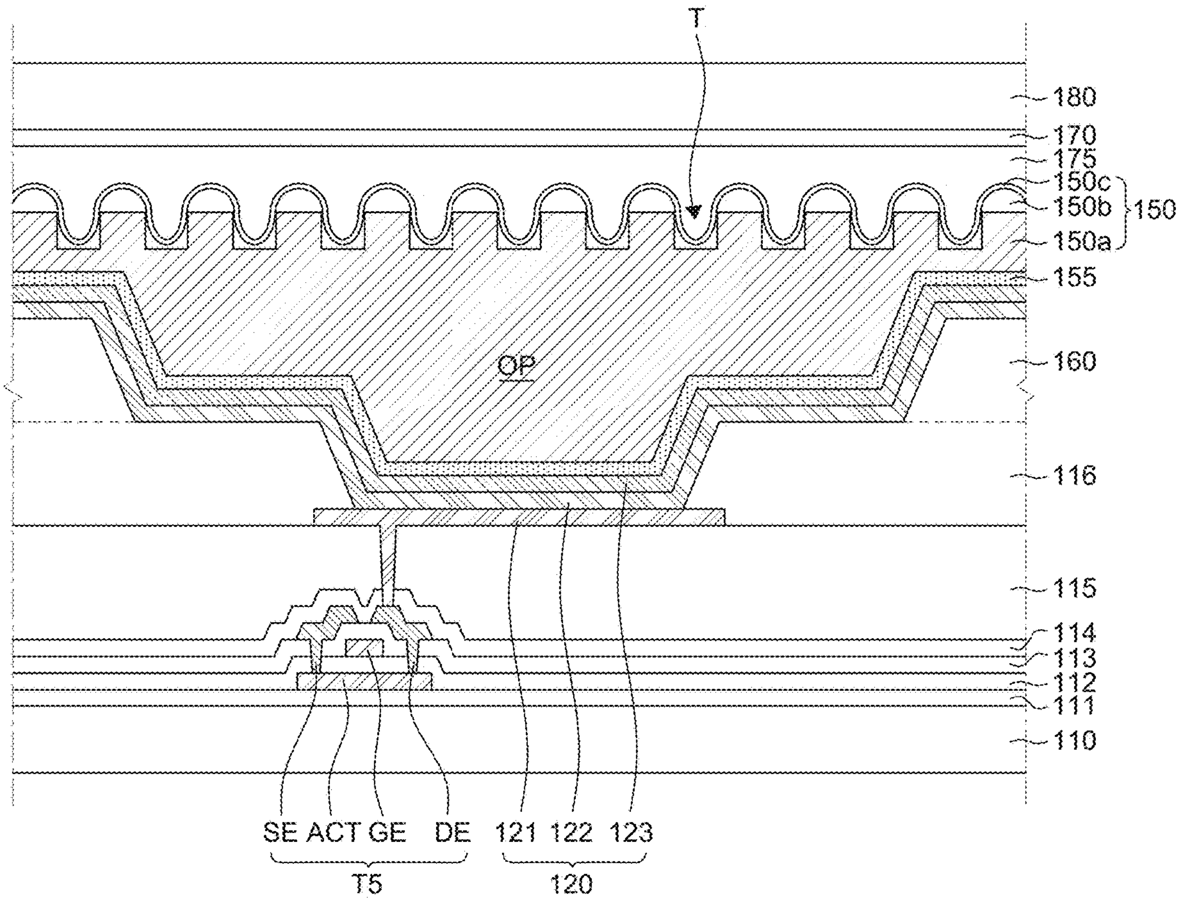
FIG. 5 is a cross-sectional view showing a part of an active area of the display panel shown in FIG. 3B according to an exemplary embodiment of the present disclosure.

FIG. 5 is a cross-sectional view showing a part of an active area of the display panel shown in FIG. 3B according to one embodiment.

FIG. 3A illustrates a primary protection film 150*a* and a trench T of the display panel PN shown in FIG. 1. For the convenience of description, illustration of the other components is omitted.

FIG. 3B is an enlarged view showing the portion A of FIG. 3A. For the convenience of description, illustration of the other components except an encapsulation layer 150, an organic layer 122, a cathode 123, a buffer layer 155, and the trench T is omitted.

For the convenience of description, FIG. 3A and FIG. 3B arbitrarily illustrate the width of the trench T and the number of trenches T. However, the present disclosure is not limited thereto.

FIG. 4 is a cross-sectional view of a part of a non-active area NA including a pad part. For the convenience of description, FIG. 4 schematically illustrates a pixel unit 140 in the pad part. The pixel unit 140 may include various components including a gate-in-panel (GIP) circuit and an insulating layer. However, the present disclosure is not limited thereto.

For the convenience of description, FIG. 5 illustrates only the fifth transistor T5 among the plurality of transistors T1, T2, T3, T4, T5 and T6, and the capacitor Cst of the pixel circuit for the sub-pixel SP of FIG. 2.

Referring to FIG. 3A, FIG. 3B through FIG. 5, the display panel PN according to the first exemplary embodiment of the present disclosure includes a substrate 110, a planarization layer 115, and a bank 116. Also, the display panel PN may include the fifth transistor T5, the light emitting diode 120, the buffer layer 155, the encapsulation layer 150, and the trench T.

The substrate 110 is a support member configured to support other components of the display device, and may be made of an insulating material.

For example, the substrate 110 may be made of glass or a resin. Further, the substrate 110 may be made of a polymer or plastic such as polyimide (PI), or may be made of a material having flexibility.

The substrate 110 may be divided into an active area AA and the non-active area NA.

The active area AA is an area where an image is displayed.

In the active area AA, a plurality of sub-pixels forming a plurality of pixels and a circuit for driving the plurality of sub-pixels may be disposed. The plurality of sub-pixels is a minimum emissive unit of the active area AA, and a display element may be disposed on each of the plurality of sub-pixels. The plurality of sub-pixels may form a pixel. For example, the light emitting diode 120 composed of an anode 121, the organic layer 122, and the cathode 123 may be disposed on each of the plurality of sub-pixels. However, the present disclosure is not limited thereto. Also, the circuit for driving the plurality of sub-pixels may include a driving element and a line. For example, the circuit may be composed of the thin film transistor T5, a storage capacitor, a gate line, a data line, etc., but is not limited thereto.

The non-active area NA is an area where an image is not displayed.

In the non-active area NA, various lines and circuits for driving the light emitting diodes 120 in the active area AA may be disposed. Although not shown in the drawings, a link line for transmitting a signal to the sub-pixels and the circuit in the active area AA, or a driver IC such as a gate driver IC or a data driver IC may be disposed in the non-active area NA. However, the present disclosure is not limited thereto.

A buffer layer 111 may be disposed on the substrate 110. The buffer layer 111 may serve to suppress permeation of moisture or impurities through the substrate 110. The buffer layer 111 may be formed as a single layer of or a multilayer of, for example, silicon oxide (SiOx) or silicon nitride (SiNx), but is not limited thereto. However, the buffer layer 111 may be omitted depending on the type of the substrate 110 or the type of the transistor, but is not limited thereto.

The fifth transistor T5 may be disposed on the buffer layer 111.

The fifth transistor T5 may include an active layer ACT, a gate electrode GE, a source electrode SE, and a drain electrode DE.

The active layer ACT may be made of a semiconductor material such as an oxide semiconductor, amorphous silicon, or polysilicon, but is not limited thereto. If the active layer ACT is made of an oxide semiconductor, the active layer ACT includes a channel region, a source region, and a drain region. The source region and the drain region may be conductive regions, but are not limited thereto.

A gate insulating layer 112 may be disposed on the active layer ACT.

The gate insulating layer 112 serves to insulate the active layer ACT and the gate electrode GE. The gate insulating layer 112 may be formed as a single layer or a multilayer of silicon oxide (SiOx) or silicon nitride (SiNx), but is not limited thereto.

The gate electrode GE may be disposed on the gate insulating layer 112.

The gate electrode GE may be made of a conductive material, for example, copper (Cu), aluminum (Al), molybdenum (Mo), nickel (Ni), titanium (Ti), chromium (Cr), or an alloy thereof, but is not limited thereto.

An interlayer insulating layer 113 may be disposed on the gate electrode GE.

Contact holes for connecting the source electrode SE and the drain electrode DE to the active layer ACT are formed in the interlayer insulating layer 113. The interlayer insulating layer 113 may be formed as a single layer or a multilayer of silicon oxide (SiOx) or silicon nitride (SiNx), but is not limited thereto.

The source electrode SE and the drain electrode DE may be disposed on the interlayer insulating layer 113.

The source electrode SE and the drain electrode DE spaced apart from each other may be electrically connected to the active layer ACT. The source electrode SE and the drain electrode DE may be made of a conductive material, such as copper (Cu), aluminum (Al), molybdenum (Mo), nickel (Ni), titanium (Ti), chromium (Cr), or an alloy thereof, but is not limited thereto.

A high potential power line and a data line may be disposed on the interlayer insulating layer 113. The high potential power line and the data line may be disposed on the same layer as the source electrode SE and the drain electrode DE and made of the same conductive material, but are not limited thereto. For example, the high potential power line and the data line may be made of a conductive material, such as copper (Cu), aluminum (Al), molybdenum (Mo), nickel (Ni), titanium (Ti), chromium (Cr), or an alloy thereof, but is not limited thereto.

A passivation layer 114 may be disposed on the high potential power line, the data line, the source electrode SE and the drain electrode DE. The passivation layer 114 is an insulating layer for protecting the components disposed under the passivation layer 114. For example, the passivation layer 114 may be formed as a single layer or a multilayer of silicon oxide (SiOx) or silicon nitride (SiNx), but is not limited thereto. In some exemplary embodiments, the passivation layer 114 may be omitted.

A planarization layer 115 may be disposed on the passivation layer 114. The planarization layer 115 is an insulating layer to planarize an upper part of the substrate 110. The planarization layer 115 may be made of an organic material, and may be formed as a single layer or a multilayer of polyimide or photo acryl, but is not limited thereto.

The planarization layer 115 may be formed extending to a part of the non-active area NA, but is not limited thereto.

A plurality of light emitting diodes 120 may be disposed in a plurality of sub-pixels on the planarization layer 115. The light emitting diode 120 may include the anode 121, the organic layer 122, and the cathode 123. Meanwhile, the organic layer 122 may be composed of an emission layer disposed in an emission area and a common layer disposed on the entire surface of the substrate 110 including the emission area, but is not limited thereto.

The anode 121 may be disposed on the planarization layer 115.

The anode 121 may be electrically connected to the fifth transistor and may receive a driving current of the pixel circuit. Since the anode 121 supplies holes to the emission layer, the anode 121 may be made of a conductive material having a high work function. The anode 121 may be made of a transparent conductive material such as indium tin oxide (ITO) or indium zinc oxide (IZO), but is not limited thereto.

Meanwhile, the display device may be implemented by a top emission type or a bottom emission type. If the display device is of the top emission type, a metallic material having excellent reflection efficiency, for example, a reflective layer made of a metal material having an excellent reflection efficiency, such as aluminum (Al) or silver (Ag), may be added under the anode 121. Therefore, light emitted from the emission layer is reflected from the anode 121 to be directed upwards, i.e., toward the cathode 123. If the display device is of the bottom emission type, the anode 121 may be made of only a transparent conductive material. Hereinafter, the description will be made under the assumption that the display device according to the first exemplary embodiment of the present disclosure is of the top emission type.

A bank 116 is disposed on the anode 121 and the planarization layer 115. The bank 116 is an insulating layer disposed between the plurality of sub-pixels to distinguish the plurality of sub-pixels.

The bank 116 includes an opening OP that exposes a part of the anode 121. The bank 116 may be an organic insulating material disposed to cover an edge or an end portion of the anode 121. The bank 116 may be made of, for example, polyimide, acryl, or a benzocyclobutene (BCB)-based resin, but is not limited thereto.

The bank 116 may be formed extending to a part of the non-active area NA. That is, for example, the bank 116 may be formed extending to a part of the non-active area NA so as to cover a side surface of an edge of the planarization layer 115. However, the present disclosure is not limited thereto.

At least one spacer 160 may be disposed on the bank 116.

When the light emitting diode 120 is formed, the spacer 160 may be disposed on the bank 116 to maintain a predetermined distance from a deposition mask. That is, the spacer 160 may allow the bank 116 and the anode 121 under the spacer 160 to maintain a predetermined distance from the deposition mask and suppress damage caused by contact. The spacer 160 may be formed into, for example, a taper shape whose width decreases toward an upper side thereof to minimize a contact area with the deposition mask.

The organic layer 122 may be disposed on the anode 121 and the bank 116.

The organic layer 122 may include an emission layer disposed in each of a plurality of sub-pixels and a common layer disposed in the plurality of sub-pixels in common. The emission layer is an organic layer configured to emit light of a specific color. Different emission layers may be disposed in a first sub-pixel, a second sub-pixel and a third sub-pixel, respectively. However, the present disclosure is not limited thereto. Each of the sub-pixels may include a plurality of emission layers to emit white light.

The common layer is an organic layer configured to improve the emission efficiency of the emission layer. The common layer may be formed as a single layer across the plurality of sub-pixels. That is, the common layer in each of the plurality of sub-pixels may be connected to each other and integrated as one body. The common layer may include a hole injection layer, a hole transport layer, an electron transport layer, an electron injection layer, a charge generation layer, etc., but is not limited thereto.

The cathode 123 may be disposed on the organic layer 122.

Since the cathode 123 supplies electrons to the organic layer 122, the cathode 123 may be made of a conductive material having a low work function. The cathode 123 may be formed as a single layer across the plurality of sub-pixels. That is, the cathode 123 in each of the plurality of sub-pixels may be connected to each other and integrated as one body. Herein, the cathode 123 may be made of a transparent conductive material such as indium tin oxide (ITO) or indium zinc oxide (IZO), or an ytterbium (Yb) alloy, and may further include a metal doping layer, but is not limited thereto. Although not shown in the drawings, a low potential power line may be electrically connected to the cathode 123, and the cathode 123 may be supplied with a low potential power signal.

As described above, the buffer layer 111, the gate insulating layer 112, the interlayer insulating layer 113, and the passivation layer 114 may be formed extending to the non-active area NA in an outer peripheral portion.

Also, the planarization layer 115 and the bank 116 may be formed thereon so as to extend to a part of the non-active area NA.

The bank 116 may be formed to cover the planarization layer 115, but is not limited thereto.

Although not shown in the drawings, a capping layer made of an organic material such as a polymer may be formed on the substrate 110 on which the cathode 123 is formed. However, the present disclosure is not limited thereto. If necessary, the capping layer may not be formed.

In case of the top emission type display device, the capping layer may have a specific refractive index to collect light to enhance the emission of light. In case of the bottom emission type display device, the capping layer serves as a buffer with respect to the cathode 123 of the light emitting diode 120.

The capping layer may serve as an optical adjustment layer. The capping layer may adjust a refractive index difference from the outside to increase the reflectance on a boundary surface between the capping layer and the outside. Through the increase in reflectance, the capping layer may exhibit the micro cavity effect at a specific wavelength. In this case, the capping layer may be formed with a different thickness for each sub-pixel.

The buffer layer 155 according to the present disclosure may be formed on the capping layer, and the encapsulation layer 150 may be formed as a multilayer on the buffer layer 155.

An element using an organic material, such as a light emitting diode, is very vulnerable to gases in the air, particularly moisture or oxygen, and has low thermal resistance and thus requires a thorough encapsulation process.

If an appropriate encapsulation process is not performed, the lifespan of the element is rapidly decreased and a dark spot is formed in the element, which results in a defective product. However, if an appropriate encapsulation process is applied to an element manufacturing process, the reliability of the element may be secured and a high-quality element may be produced.

The encapsulation process is largely categorized into two processes.

First, there is a lid-type process in which a getter is attached to the inside of a lid made of glass or metal and then attached to an element with an adhesive having low moisture permeability. Second, there is a thin film-type process in which various kinds of films are laminated and then attached to a light emitting diode or a film is deposited directly on a light emitting diode.

The films used in the thin film-type process are mainly made of materials having excellent oxygen- and moisture-blocking properties. Also, chemical vapor deposition (CVD), plasma enhanced chemical vapor deposition (PECVD), and atomic layer deposition (ALD) may be used for deposition.

Specifically, the encapsulation layer 150 serving as an encapsulation means may be formed as follows. A capping layer is formed on an upper surface of the substrate 110 on which the light emitting diode 120 is formed, and the primary protection film 150*a*, an organic film 150*b* and a secondary protection film 150*c* are sequentially formed thereon. However, the number of inorganic films and organic films forming the encapsulation layer 150 is not limited thereto.

A protection film 180 formed as a multilayer for encapsulation may be disposed on the entire surface of the substrate 110 including the secondary protection film 150*c*. A transparent adhesive 175 may be interposed between the encapsulation layer 150 and the protection film 180.

The protection film 180 may be formed as a cover plastic.

Also, the adhesive 175 may be formed as an optically transparent film (OCA) or a pressure sensitive adhesive (PSA).

Meanwhile, a touch electrode may be further disposed on the uppermost layer of the encapsulation layer 150 or on the adhesive 175. The touch electrode is referred to as a touch-on-encapsulation (TOE) layer.

Alternatively, a color filter layer may be further disposed on the uppermost layer of the encapsulation layer 150 or on the adhesive 175. This structure is referred to as a color filter-on-encapsulation (COE). In this case, a touch electrode may be disposed on or under the color filter layer.

A polarization layer 170 may be interposed between the protection film 180 and the adhesive 175. However, the present disclosure is not limited thereto.

Meanwhile, according to the present disclosure, the trench T is formed in a surface of the primary protection film 150*a* to reduce reflection of external light.

That is, conventionally, a surface of a primary protection film of an encapsulation layer is planarized and external light is reflected from a cathode, and thus, visibility is degraded. Therefore, when a display device is used outdoors, display quality may be degraded, which causes inconvenience in recognizing information.

In this regard, according to the present disclosure, a plurality of trenches T is formed in the surface of the primary protection film 150*a* of the encapsulation layer 150 on the cathode 123. Thus, external light may travel to the inside of the trench T or may be confined inside the trench T to suppress reflection of the external light. Accordingly, display quality may be enhanced by improving visibility and privacy in displaying information may be enhanced.

The plurality of trenches T may be disposed on the plane to be parallel in one direction, for example, a data line direction (see FIG. 3A and FIG. 3B). However, the present disclosure is not limited thereto. The plurality of trenches T may be disposed in a lattice pattern in both directions, for example, the data line direction and a gate line direction. However, the present disclosure is not limited thereto. The plurality of trenches T may be disposed to be inclined at a predetermined angle with respect to the data line direction or the gate line direction.

The trench T may be formed in the surface of the primary protection film 150*a* by depositing an inorganic film to form the primary protection film 150*a*, followed by a dry etching process such as reactive ion etching (RIE) or a Bosch process. Since the organic layer 122 of the light emitting diode 120 is deposited under the primary protection film 150*a*, the dry etching process is used in one embodiment.

The RIE is a physical chemical etching method. The physical method may be used to assist chemical etching, or the physical method may be used to produce an etchant reactant involved in chemical etching. The RIE uses both a reactive gas ionized by plasma and positive ion bombardment in the plasma and provides rapid anisotropic etching with high etch selectivity that supplement the disadvantages of the respective methods.

Also, the Bosch process refers to an in-situ process for repeated etching and deposition on a substrate including material films in a processing chamber of a dry etching apparatus.

The trenches T may be formed throughout the entire active area AA. Alternatively, the trenches T may be formed extending to a part of the non-active area NA. FIG. 4 illustrates an example where the trenches T are formed extending to edges of the planarization layer 115 and the bank 116. However, the present disclosure is not limited thereto. The trenches T of the present disclosure may be formed extending to an edge of the primary protection film 150*a* (see FIG. 3B).

For example, the trench T may have a width of about 5 μm and a depth of about 5 μm with an aspect ratio of 1:1, but is not limited thereto.

Also, according to the present disclosure, the organic film 150*b* is conformally formed on the primary protection film 150*a* including the plurality of trenches T through a vapor deposition process.

The organic film 150*b* may be formed extending to a part of the non-active area NA.

The organic film 150*b* may be formed to cover the primary protection film 150*a*, but is not limited thereto.

That is, in the vapor deposition process unlike a conventional ink jet printing method, the organic film 150*b* may be deposited conformally or in a liquid type on the primary protection film 150*a* by adjusting processing conditions. The organic film formed by vapor deposition may vary in morphological characteristics depending on the kind of a monomer and processing conditions.

According to the present disclosure, the organic film 150*b* is conformally formed on the primary protection film 150*a* including the plurality of trenches T through an initiated chemical vapor deposition (iCVD) process. The organic film 150*b* may be deposited along an inner contour shape of the trenches T through the iCVD process as long as it has a sufficiently small thickness. For example, if the trench T has a width of about 5 μm and a depth of about 5 μm, the organic film 150*b* may be conformally deposited with a thickness of about 0.5 μm along the inner contour shape of the trenches T through the iCVD process. It may therefore be understood that in some embodiments, the thickness of the organic film measured perpendicular to the underlying surface of the trench is no more than 30%, optionally no more than 20%, optionally no more than 10%, of the width or the depth of the trench. The organic film includes undulations conforming to the trenches. That is, at least a portion of the upper surface of the organic film over the lowest surface of each individual trench is lower than the uppermost surface of the primary protection film between the trenches.

In the iCVD process unlike the conventional ink jet printing method, the organic film 150*b* may be deposited to be conformal, flowable or flat depending on processing conditions.

The iCVD process uses a polymerase chain reaction using free radicals and known as a liquid phase process. In the iCVD process, a polymer thin film may be deposited on a surface of a substrate by vaporizing an initiator and a monomer to cause a polymer reaction in a gas phase. In this case, when the initiator and the monomer are simply mixed, the polymerase chain reaction does not occur. However, when the initiator is decomposed into radicals by a hot filament located inside a gas-phase reactor, the monomer may be activated and the polymerase chain reaction may occur.

The iCVD process uses only a monomer and radicals to cause a reaction without an organic solvent or other additives. Thus, the iCVD process may form a high-purity thin film compared to a conventional polymer synthesis method using a liquid-phase process. That is, the iCVD process does not use an organic solvent, and thus, any problem caused by various impurities does not occur. Also, the iCVD process is a dry process and thus enables deposition on various kinds of substrates. Further, the iCVD process is performed at room temperature, and thus, damage caused by heat does not occur in a light emitting diode.

As described above, according to the first exemplary embodiment of the present disclosure, the organic film 150*b* is deposited on the primary protection film 150*a* along the inner contour shape of the trenches T through the iCVD process. Thus, it is possible to suppress reflection of external light. External light is confined inside the trench T due to the structure of the trench T and the organic film 150*b* formed conformally through a vapor deposition process. Therefore, it is possible to reduce the amount of reflected light. That is, visible light introduced from the outside is diffused and reflected due to curves of the organic film 150*b* formed conformally along the inner contour shape of the trenches T, and confined inside the trench T.

According to the present disclosure, on the organic film 150*b*, which is formed through the vapor deposition process, the secondary protection film 150*c* may be prepared as an inorganic film through an atomic layer deposition (ALD) process. The ALD process enables the secondary protection film 150*c* to be deposited thinly and evenly on a bottom surface of the trench T. The ALD process ensures a uniformly thick layer regardless of the orientation of the portion of the surface. Therefore, it may be understood that any layer described in this disclosure as being deposited by ALD is uniformly thick. That is, for example, when the trench T has a width of about 5 μm and a depth of about 5 μm, the secondary protection film 150*c* may be conformally deposited with a thickness of about 5 nm along a surface shape of the organic film 150*b* through the ALD process.

The secondary protection film 150*c* may be formed extending to a part of the non-active area NA.

The secondary protection film 150*c* may be formed to cover the organic film 150*b*, but is not limited thereto.

As described above, according to the first exemplary embodiment of the present disclosure, the secondary protection film 150*c*, which is an inorganic film, is deposited on the organic film 150*b* through the ALD process. Thus, it is possible to enhance moisture barrier properties.

The vapor deposition for the organic film 150*b* and the ALD for the secondary protection film 150*c* may be repeated several times if necessary. Thus, these films are thin, but may have substantially perfect encapsulation properties.

Meanwhile, as described above, the encapsulation layer 150 according to the first exemplary embodiment of the present disclosure is composed of three films. The three films include the primary protection film 150*a*, the organic film 150*b*, and the secondary protection film 150*c*. However, the present disclosure is not limited thereto. The encapsulation layer 150 may have a multilayer structure including four or more films.

The three-layer structure is the most ideal structure. Even if there is a small foreign material, the organic film 150*b* formed through the iCVD process may cover the foreign material, and thus, the secondary protection film 150*c* may be seamlessly deposited thereon.

Figure 6:
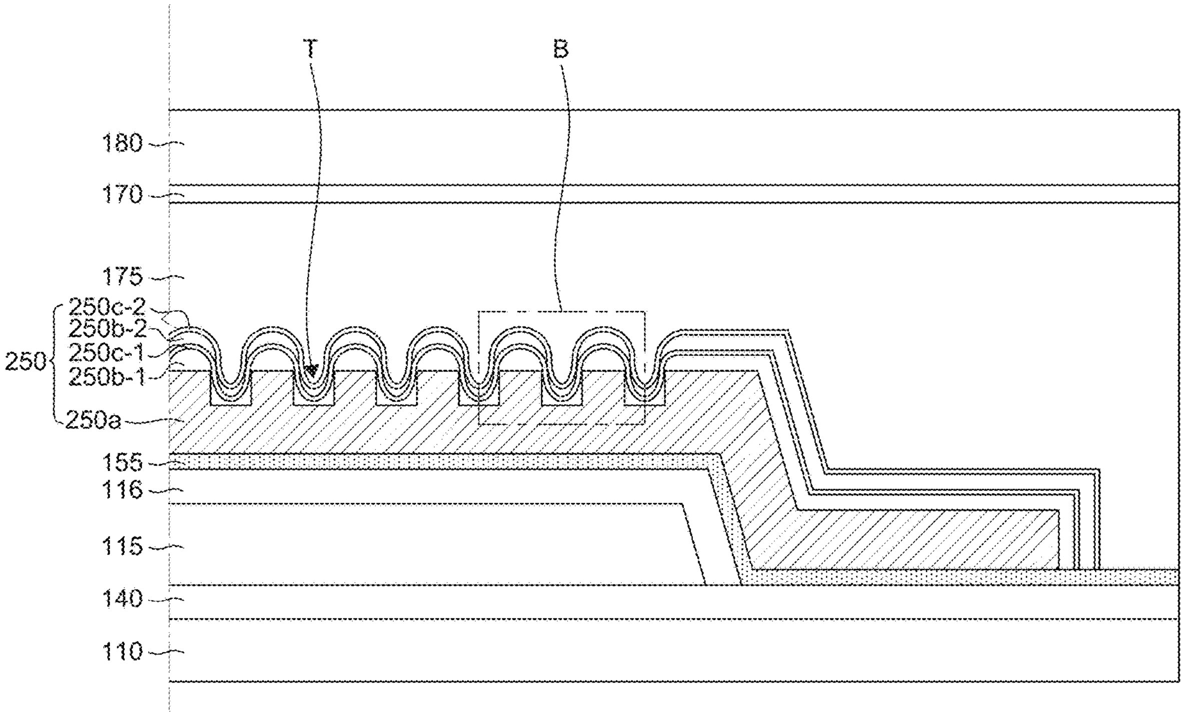
FIG. 6 is a cross-sectional view showing a part of a display panel according to a second exemplary embodiment of the present disclosure.

FIG. 6 is a cross-sectional view showing a part of a display panel according to a second exemplary embodiment of the present disclosure.

Figure 7:
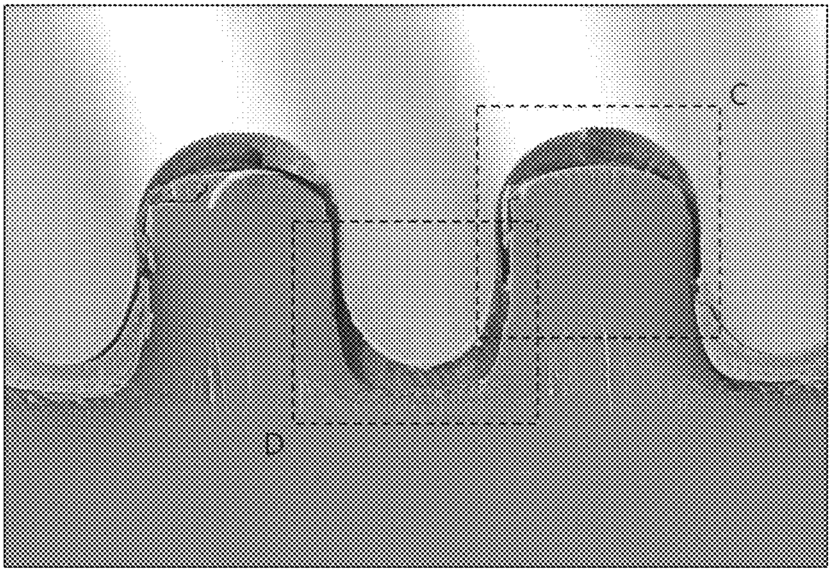
FIG. 7 is a scanning electron microscope (SEM) image of a portion B of FIG. 6 according to an exemplary embodiment of the present disclosure.

FIG. 7 is a scanning electron microscope (SEM) image of a portion B of FIG. 6 according to one embodiment.

Figure 8A:
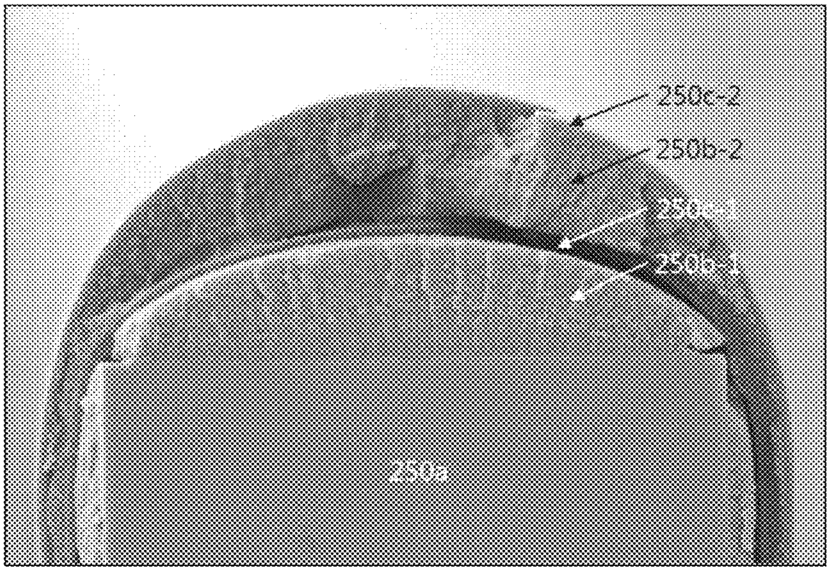
FIG. 8A and FIG. 8B are SEM images enlarging a portion C and a portion D of FIG. 7 according to an exemplary embodiment of the present disclosure.
Figure 8B:
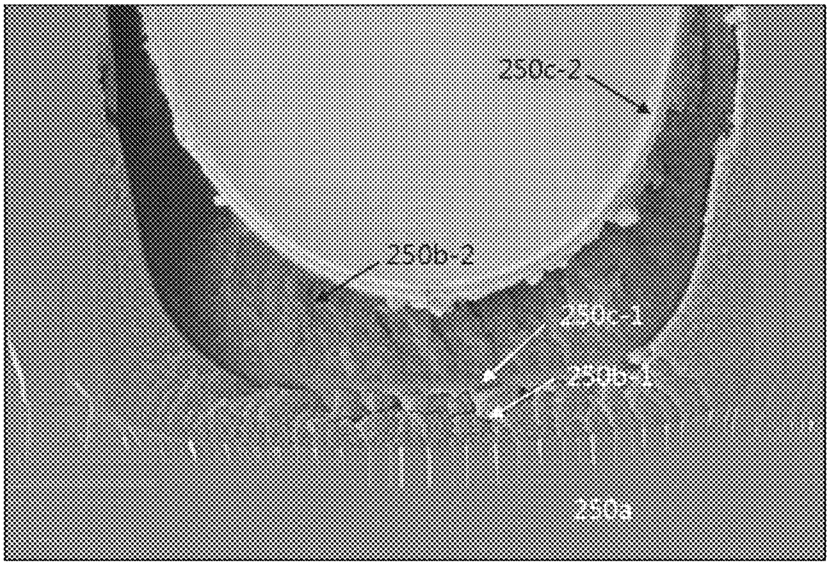

FIG. 8A and FIG. 8B are SEM images enlarging a portion C and a portion D of FIG. 7 according to one embodiment.

The display panel according to the second exemplary embodiment of the present disclosure as shown in FIG. 6 is substantially the same as the display panel according to the first exemplary embodiment as shown in FIG. 3A, FIG. 3B through FIG. 5 except that an encapsulation layer 250 is composed of five films. Therefore, a repeated description thereof will be omitted. The same reference numerals denote the same components.

FIG. 6 is a cross-sectional view of a part of a non-active area including a pad part according to one embodiment. For the convenience of description, FIG. 6 schematically illustrates the pixel unit 140 in the pad part. The pixel unit 140 may include various components including the gate-in-panel (GIP) circuit and the insulating layer. However, the present disclosure is not limited thereto.

FIG. 7, FIG. 8A, and FIG. 8B illustrate examples of a cross-sectional structure of the encapsulation layer 250 composed of five films deposited on a trench having a width of about 5 μm and a depth of about 5 μm.

FIG. 7, FIG. 8A, and FIG. 8B illustrate an example where the trench has an aspect ratio of 1:1.

Referring to FIG. 6 through FIG. 8A, and FIG. 8B, the display panel according to the second exemplary embodiment of the present disclosure may include the substrate 110, the planarization layer 115, and the bank 116. Also, the display panel may include the pixel unit 140, a plurality of transistors, a light emitting diode, the buffer layer 155, the encapsulation layer 250, and the plurality of trenches T.

The planarization layer 115 may be disposed on the pixel unit 140. The planarization layer 115 may be formed extending to a part of the non-active area, but is not limited thereto.

A plurality of light emitting diodes may be disposed in a plurality of sub-pixels on the planarization layer 115.

The bank 116 may be disposed on the planarization layer 115.

The bank 116 may be formed extending to a part of the non-active area. That is, for example, the bank 116 may be formed extending to a part of the non-active area so as to cover the side surface of the edge of the planarization layer 115. However, the present disclosure is not limited thereto.

The buffer layer 155 according to the present disclosure may be formed on the bank 116, and the encapsulation layer 250 may be formed as a multilayer on the buffer layer 155.

Herein, the encapsulation layer 250 according to the second exemplary embodiment of the present disclosure is composed of a primary organic film 250*b*-1, a secondary protection film 250*c*-1, a secondary organic film 250*b*-2, and a tertiary protection film 250*c*-2 sequentially laminated on a primary protection film 250*a*.

The protection film 180 formed as a multilayer for encapsulation may be disposed on the entire surface of the substrate 110 including the tertiary protection film 250*c*-2. The transparent adhesive 175 may be interposed between the encapsulation layer 250 and the protection film 180.

The polarization layer 170 may be interposed between the protection film 180 and the adhesive 175. However, the present disclosure is not limited thereto.

Meanwhile, according to the present disclosure, the trench T is formed in a surface of the primary protection film 250*a* to reduce reflection of external light.

The plurality of trenches T may be disposed on the plane to be parallel in one direction, for example, the data line direction. However, the present disclosure is not limited thereto. The plurality of trenches T may be disposed in a lattice pattern in both directions, for example, the data line direction and the gate line direction. However, the present disclosure is not limited thereto. The plurality of trenches T may be disposed to be inclined at a predetermined angle with respect to the data line direction or the gate line direction.

The trenches T may be formed throughout the entire active area. The trenches are formed at least over the (e.g., entire) emission areas of the subpixels.

Alternatively, the trenches T may be formed extending to a part of the non-active area. FIG. 6 illustrates an example where the trenches T are formed extending to edges of the planarization layer 115 and the bank 116. However, the present disclosure is not limited thereto. The trenches T of the present disclosure may be formed extending to an edge of the primary protection film 250*a*.

According to the present disclosure, the primary organic film 250*b*-1 is conformally formed on the primary protection film 250*a* including the plurality of trenches T through a vapor deposition process.

The primary organic film 250*b*-1 may be formed extending to a part of the non-active area.

The primary organic film 250*b*-1 may be formed to cover the primary protection film 250*a*, but is not limited thereto.

Particularly, according to the second exemplary embodiment of the present disclosure, the primary organic film 250*b*-1 is conformally formed on the primary protection film 250*a* including the plurality of trenches T along the inner contour shape of the trenches T through the iCVD process.

The primary organic film 250*b*-1 formed through the iCVD process may serve as a foreign material buffer layer to effectively cover a foreign material generated after a cathodic process of the light emitting diode. Since the primary organic film 250*b*-1 covers the foreign material, subsequent layers may be seamlessly deposited thereon.

The primary organic film 250*b*-1 is conformally formed on the primary protection film 250*a* through the iCVD process. The primary organic film 250*b*-1 may be deposited forming curves with a greater thickness on the bottom surface of the trench T and an upper surface of the primary protection film 250*a* than on a side surface of the trench T. That is, for example, the primary organic film 250*b*-1 may be deposited in an upturned U-shape on the upper surface of the primary protection film 250*a* and deposited in a U-shape inside the trench T, but is not limited thereto.

Also, according to the second exemplary embodiment of the present disclosure, the secondary protection film 250*c*-1 formed by ALD, the secondary organic film 250*b*-2 formed by iCVD, and the tertiary protection film 250*c*-2 formed by ALD are sequentially laminated on the primary organic film 250*b*-1 formed by iCVD.

The secondary protection film 250*c*-1, the secondary organic film 250*b*-2, and the tertiary protection film 250*c*-2 deposited on the primary organic film 250*b*-1 have moisture barrier properties. Thus, they may protect the light emitting diode from moisture and oxygen.

The secondary protection film 250*c*-1 may be conformally deposited with a smaller thickness than the primary organic film 250*b*-1 along a surface shape of the primary organic film 250*b*-1 through the ALD process. The secondary protection film may be deposited with uniform thickness regardless of the orientation of the underlying surface due to the nature of the ALD process. Therefore, the secondary protection film has a uniform thickness.

Also, the secondary organic film 250*b*-2 may be conformally formed on the secondary protection film 250*c*-1 through the iCVD process. The secondary organic film 250*b*-2 may be deposited forming curves with a greater thickness on the bottom surface of the trench T and an upper surface of the secondary protection film 250*c*-1 than on the side surface of the trench T. That is, for example, the secondary organic film 250*b*-2 may be deposited in an upturned U-shape on the upper surface of the secondary protection film 250*c*-1 and deposited in a U-shape inside the trench T, but is not limited thereto.

The tertiary protection film 250*c*-2 may be conformally deposited with a smaller thickness than the secondary organic film 250*b*-2 along a surface shape of the secondary organic film 250*b*-2 through the ALD process. The tertiary protection film may be deposited with uniform thickness regardless of the orientation of the underlying surface due to the nature of the ALD process. Therefore, the tertiary protection film has a uniform thickness over its entire area.

The above-described encapsulation layer 250 according to the second exemplary embodiment of the present disclosure is composed of five films and may have a step coverage of 74.7% to 85.4% based on the side surface of the trench T.

Meanwhile, if there is no foreign material generated after a cathodic process, the encapsulation layer 250 may have a four-layer structure instead of the above-described five-layer structure in consideration of cost and productivity. The four-layer structure may include a secondary protection film formed by ALD, an organic film formed by iCVD, and a tertiary protection film formed by ALD on a primary protection layer. It may be understood that although ALD is described as the deposition process for some of the films or layers described in the present disclosure, MLD (molecular layer deposition) may alternatively be used for deposition of those films or layers.

In the display device according to the second exemplary embodiment of the present disclosure, the plurality of trenches T is formed in the surface of the primary protection film 250*a*. Thus, external light may travel to the inside of the trench T or may be confined inside the trench T to suppress reflection of the external light. This will be described in detail with reference to FIG. 9A through FIG. 9C.

Figure 9A:
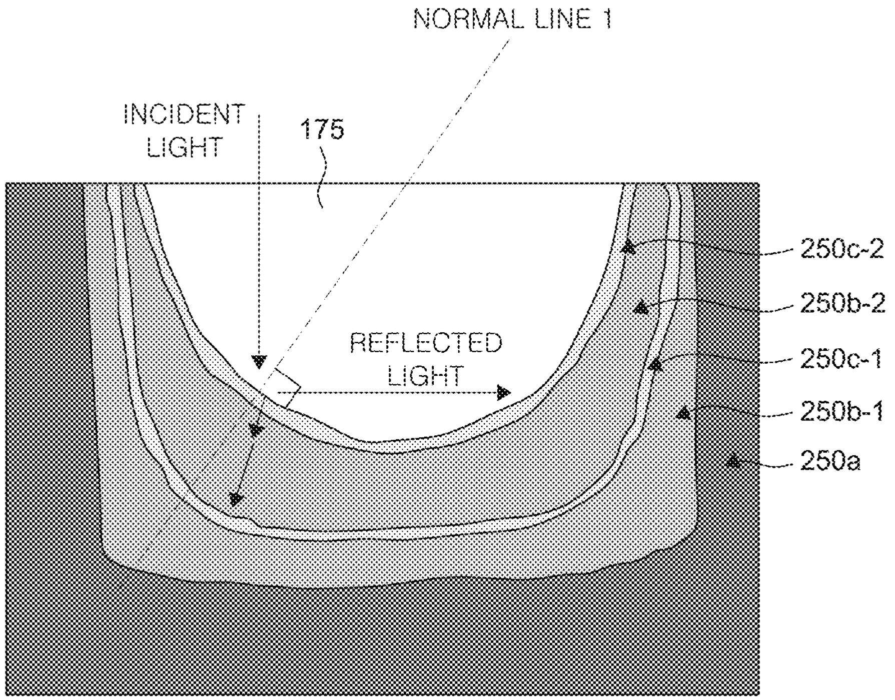
FIGS. 9A, 9B, and 9C are cross-sectional views for explaining reflection of external light in a trench structure according to an exemplary embodiment of the present disclosure.
Figure 9B:
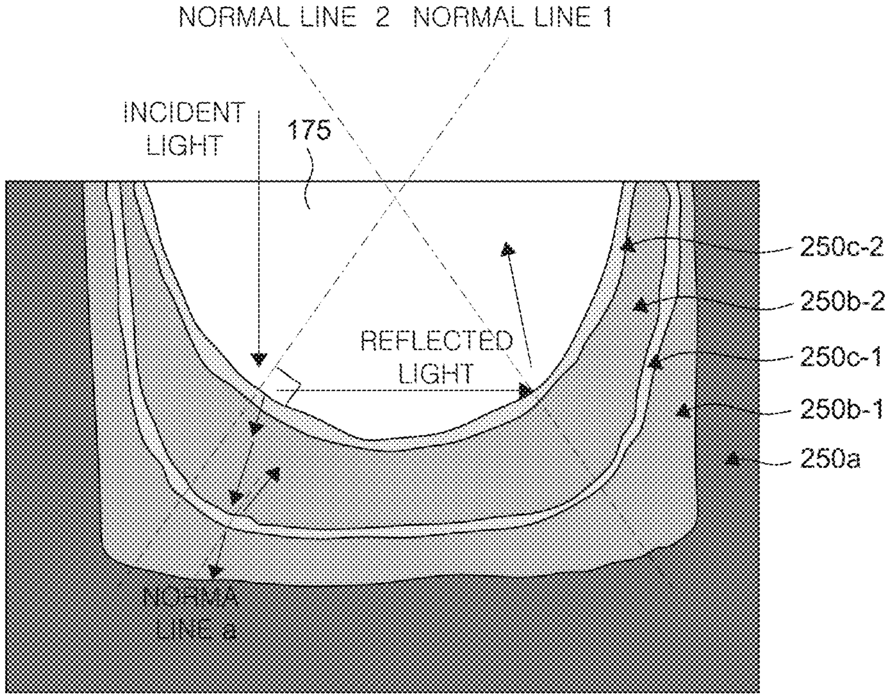
Figure 9C:
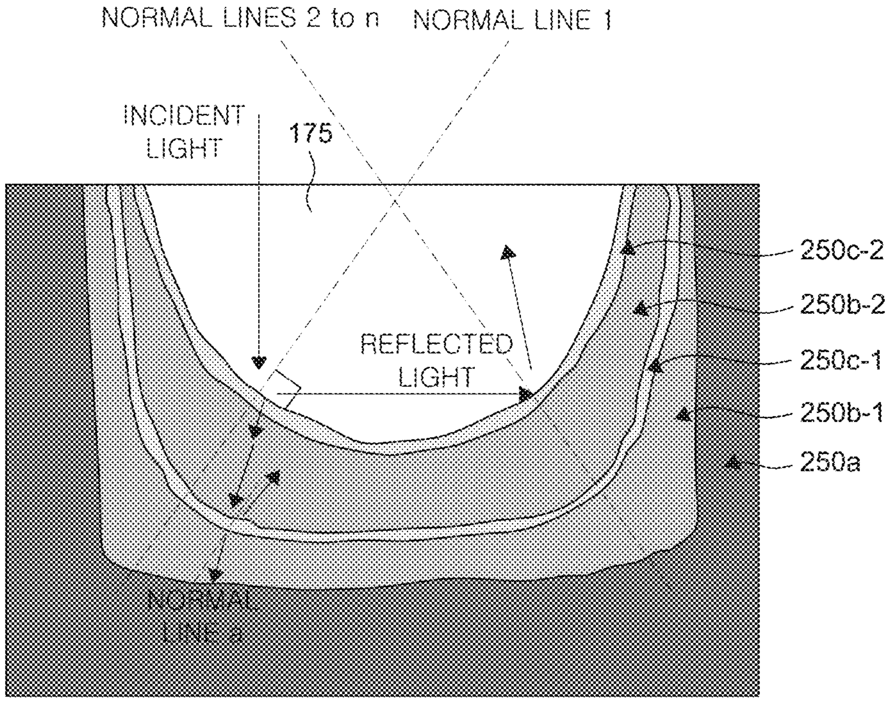

FIG. 9A through FIG. 9C are cross-sectional views for explaining reflection of external light in a trench structure according to one embodiment of the present disclosure.

FIG. 9A through FIG. 9C illustrate an example where the primary organic film 250*b*-1, the secondary protection film 250*c*-1, the secondary organic film 250*b*-2, and the tertiary protection film 250*c*-2 are sequentially laminated in a U-shape inside the trench according to the second exemplary embodiment of the present disclosure. In this example, the U-shape is filled with the adhesive 175.

Referring to FIG. 9A through FIG. 9C, refractive indexes of the adhesive 175, the primary organic film 250*b*-1 and the secondary organic film 250*b*-2 formed by iCVD, and the secondary protection film 250*c*-1 and the tertiary protection film 250*c*-2 formed by ALD may be set to cause total internal reflection. The total internal reflection occurs when light is incident at a boundary between two media at an angle (relative to a normal of the boundary) greater than a threshold angle.

In one embodiment, the adhesive 175 may have a refractive index in a range of 1.41 to about 1.53, and the primary organic film 250*b*-1 and the secondary organic film 250*b*-2 formed by iCVD may have a refractive index in a range of 1.40 to about 1.55. Also, the secondary protection film 250*c*-1 and the tertiary protection film 250*c*-2 formed by ALD may have a refractive index in a range of 1.40 to about 1.80.

For example, the adhesive 175 made of OCA may have a refractive index of about 1.5, and the primary organic film 250*b*-1 and the secondary organic film 250*b*-2 formed by iCVD may have a refractive index of about 1.5. Further, the secondary protection film 250*c*-1 and the tertiary protection film 250*c*-2 made of SiON by ALD may have a refractive index of about 1.7.

However, the present disclosure is not limited thereto. For example, SiON for ALD may vary in refractive index depending on the ratio of gases such as SiH4, NH3, N2O, and the like. A high refractive index of 1.8 or more may be achieved by using ZnS, TiO2, ZnO, ZrO2, and the like.

For example, the trench may have a width of about 5 μm and a depth of about 5 μm with an aspect ratio of 1:1, but is not limited thereto. The amount of external light confined inside the trench is more greatly affected by the depth of the trench than by the width of the trench.

Referring to FIG. 9A through FIG. 9C, in order for external light to be confined inside the trench, the secondary protection film 250*c*-1 and the tertiary protection film 250*c*-2 formed by ALD may be made of a relatively dense material. Also, the primary organic film 250*b*-1 and the secondary organic film 250*b*-2 formed by iCVD may be made of a relatively sparse material.

Since reflected light relative to incident light is reflected from an uneven surface (normal lines 1, 2, . . . , n), a light path changes. When this process is repeated n times, external light is scattered. Also, refracted light (normal line a) relative to incident light is refracted to a dense medium in a direction opposite to the incident direction of the external light. As this process is repeated, the intensity of the reflected light decreases, and thus, display quality may be enhanced. The intensity of the reflected light is indicated by the length of an arrow in FIG. 9A through FIG. 9C.

Meanwhile, according to the present disclosure, a trench may have a rectangular shape or a protrusion of a primary protection film on a side surface of the trench may have a rectangular shape in a cross-sectional view. However, the present disclosure is not limited thereto. That is, according to the present disclosure, the protrusion of the primary protection film on the side surface of the trench may have a triangular shape or a trapezoidal shape in a cross-sectional view.

Figure 10A:
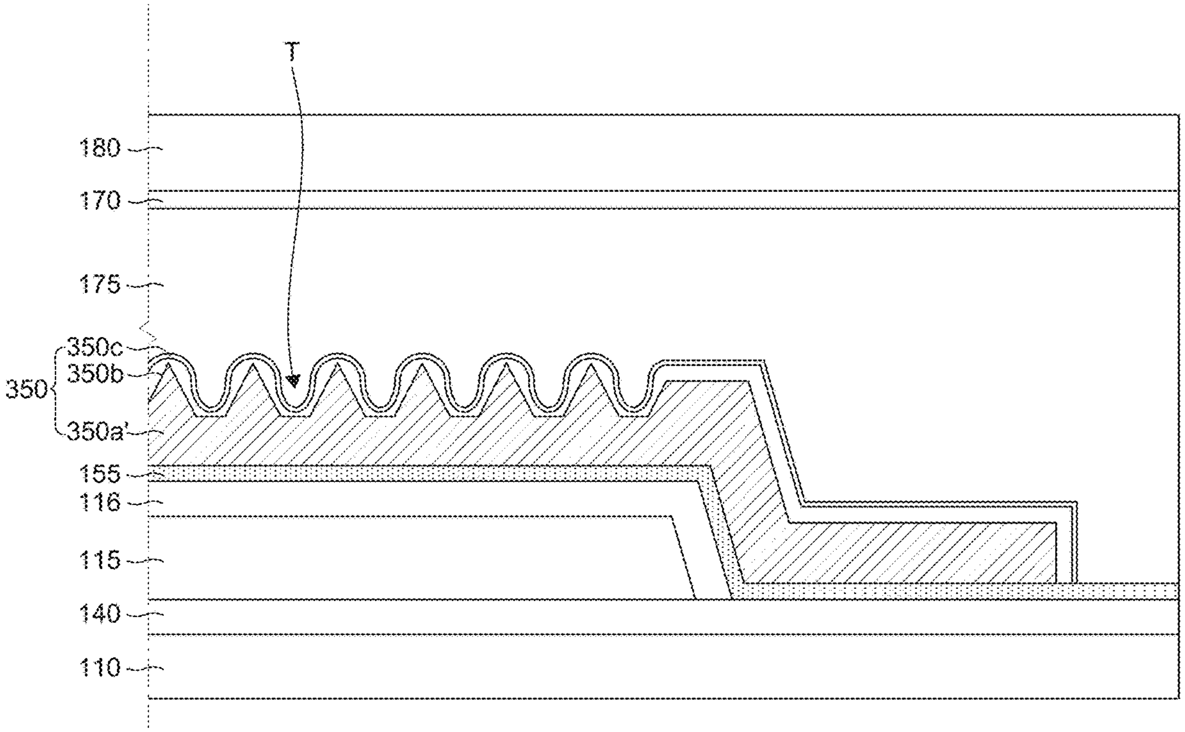
FIG. 10A and FIG. 10B are cross-sectional views showing a part of a display panel according to a third exemplary embodiment of the present disclosure.
Figure 10B:
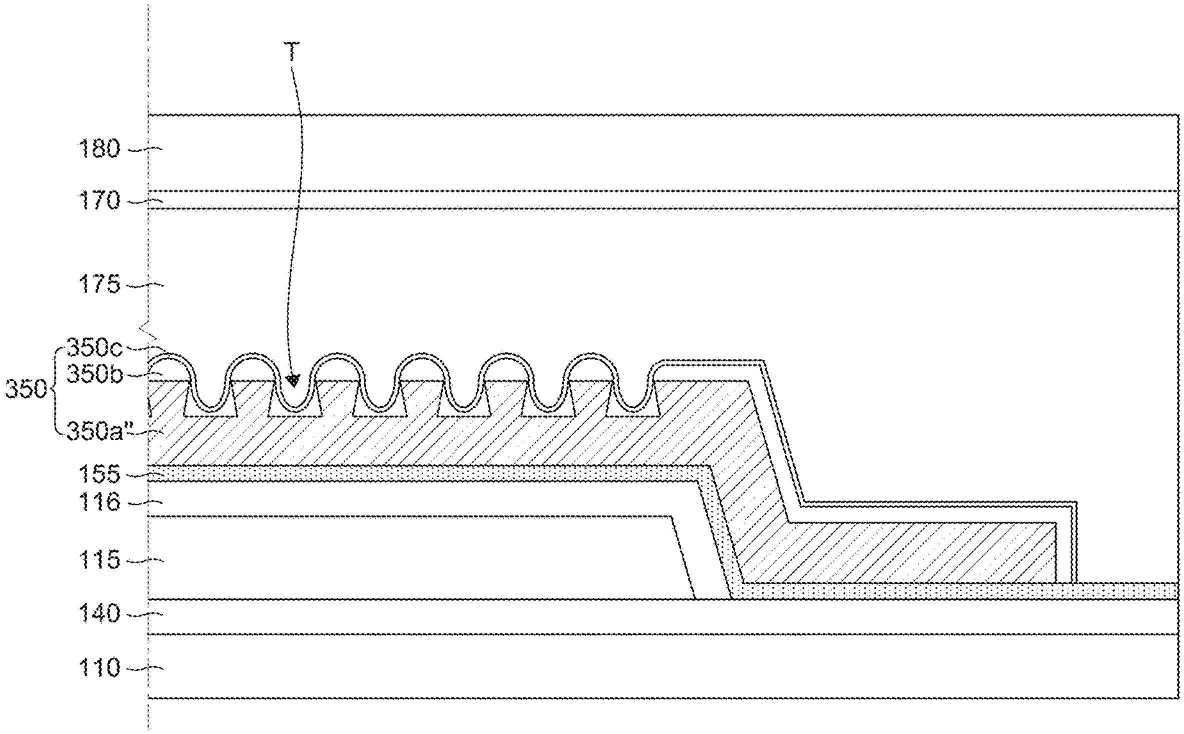

FIG. 10A and FIG. 10B are cross-sectional views showing a part of a display panel according to a third exemplary embodiment of the present disclosure.

The display panel according to the third exemplary embodiment of the present disclosure as shown in FIG. 10A and FIG. 10B is substantially the same as the display panel according to the first exemplary embodiment as shown in FIG. 3A, FIG. 3B through FIG. 5 except the shape of the trench T. The shape of the trench T includes the shape of a primary protective film 350*a*' or 350*a*" on the side surface of the trench T. Therefore, a repeated description thereof will be omitted. The same or like reference numerals denote the same or similar components.

FIG. 10A and FIG. 10B are cross-sectional views of a part of a non-active area including a pad part. For the convenience of description, FIG. 10A and FIG. 10B schematically illustrate the pixel unit 140 in the pad part. The pixel unit 140 may include various components including the gate-in-panel (GIP) circuit and the insulating layer. However, the present disclosure is not limited thereto.

Referring to FIG. 10A and FIG. 10B, the display panel according to the third exemplary embodiment of the present disclosure may include the substrate 110, the planarization layer 115, and the bank 116. Also, the display panel may include the pixel unit 140, a plurality of transistors, a light emitting diode, the buffer layer 155, an encapsulation layer 350, and the plurality of trenches T.

The planarization layer 115 may be disposed on the pixel unit 140. The planarization layer 115 may be formed extending to a part of the non-active area, but is not limited thereto.

A plurality of light emitting diodes may be disposed in a plurality of sub-pixels on the planarization layer 115.

The bank 116 may be disposed on the planarization layer 115.

The bank 116 may be formed extending to a part of the non-active area. That is, for example, the bank 116 may be formed extending to a part of the non-active area so as to cover the side surface of the edge of the planarization layer 115. However, the present disclosure is not limited thereto.

The buffer layer 155 according to the present disclosure may be formed on the bank 116, and the encapsulation layer 350 may be formed as a multilayer on the buffer layer 155.

Herein, the encapsulation layer 350 according to the third exemplary embodiment of the present disclosure is composed of an organic film 350*b* and a secondary protection film 350*c* sequentially laminated on the primary protection film 350*a*' or 350*a*".

The protection film 180 formed as a multilayer for encapsulation may be disposed on the entire surface of the substrate 110 including the secondary protection film 350*c*. The transparent adhesive 175 may be interposed between the encapsulation layer 350 and the protection film 180.

The polarization layer 170 may be interposed between the protection film 180 and the adhesive 175. However, the present disclosure is not limited thereto.

As described above, according to the present disclosure, the trench T is formed in a surface of the primary protection film 350*a*' or 350*a*" to reduce reflection of external light.

The plurality of trenches T may be disposed on the plane to be parallel in one direction, for example, the data line direction. However, the present disclosure is not limited thereto. The plurality of trenches T may be disposed in a lattice pattern in both directions, for example, the data line direction and the gate line direction. However, the present disclosure is not limited thereto. The plurality of trenches T may be disposed to be inclined at a predetermined angle with respect to the data line direction or the gate line direction.

The trenches T may be formed throughout the entire active area.

Alternatively, the trenches T may be formed extending to a part of the non-active area. FIG. 10A and FIG. 10B illustrate an example where the trenches T are formed extending to edges of the planarization layer 115 and the bank 116. However, the present disclosure is not limited thereto. The trenches T of the present disclosure may be formed extending to an edge of the primary protection film 350*a*' or 350*a*".

According to the third exemplary embodiment of the present disclosure, the protrusion of the primary protection film 350*a*' or 350*a*" on the side surface of the trench T has a triangular shape (see FIG. 10A) or a trapezoidal shape (see FIG. 10B) in a cross-sectional view.

The primary protection film 350*a*" shown in FIG. 10B has a trapezoidal shape having a lower base shorter than an upper base in a cross-sectional view.

As a side surface of the protrusion of the primary protection film 350*a*' or 350*a*" on the side surface of the trench T is formed at a more acute angle to the surface of the substrate 110, reflection of external light incident vertically may be reduced. Thus, the protrusion of the primary protection film 350*a*" having a trapezoidal shape in a cross-sectional view as shown in FIG. 10B is used for display quality.

As described above, according to the present disclosure, the organic film 350*b* is conformally formed on the primary protection film 350*a*' or 350*a*" including the plurality of trenches T through a vapor deposition process.

The organic film 350*b* may be formed extending to a part of the non-active area.

The organic film 350*b* may be formed to cover the primary protection film 350*a*' or 350*a*", but is not limited thereto.

According to the third exemplary embodiment of the present disclosure, the organic film 350*b* is conformally formed on the primary protection film 350*a*' or 350*a*" including the plurality of trenches T along the inner contour shape of the trenches T through the iCVD process.

Also, according to the third exemplary embodiment of the present disclosure, the secondary protection film 350*c* formed by ALD is laminated on the organic film 350*b* formed by iCVD.

The secondary protection film 350*c* deposited on the organic film 350*b* has moisture barrier properties. Thus, it may protect the light emitting diode from moisture and oxygen.

The secondary protection film 350*c* may be conformally deposited with a smaller thickness than the organic film 350*b* along a surface shape of the organic film 350*b* through the ALD process.

Meanwhile, as described above, the plurality of trenches T may be disposed on the plane to be parallel in one direction, for example, the data line direction. However, the present disclosure is not limited thereto. The plurality of trenches T may be disposed in a lattice pattern in both directions, for example, the data line direction and the gate line direction.

Figure 11:
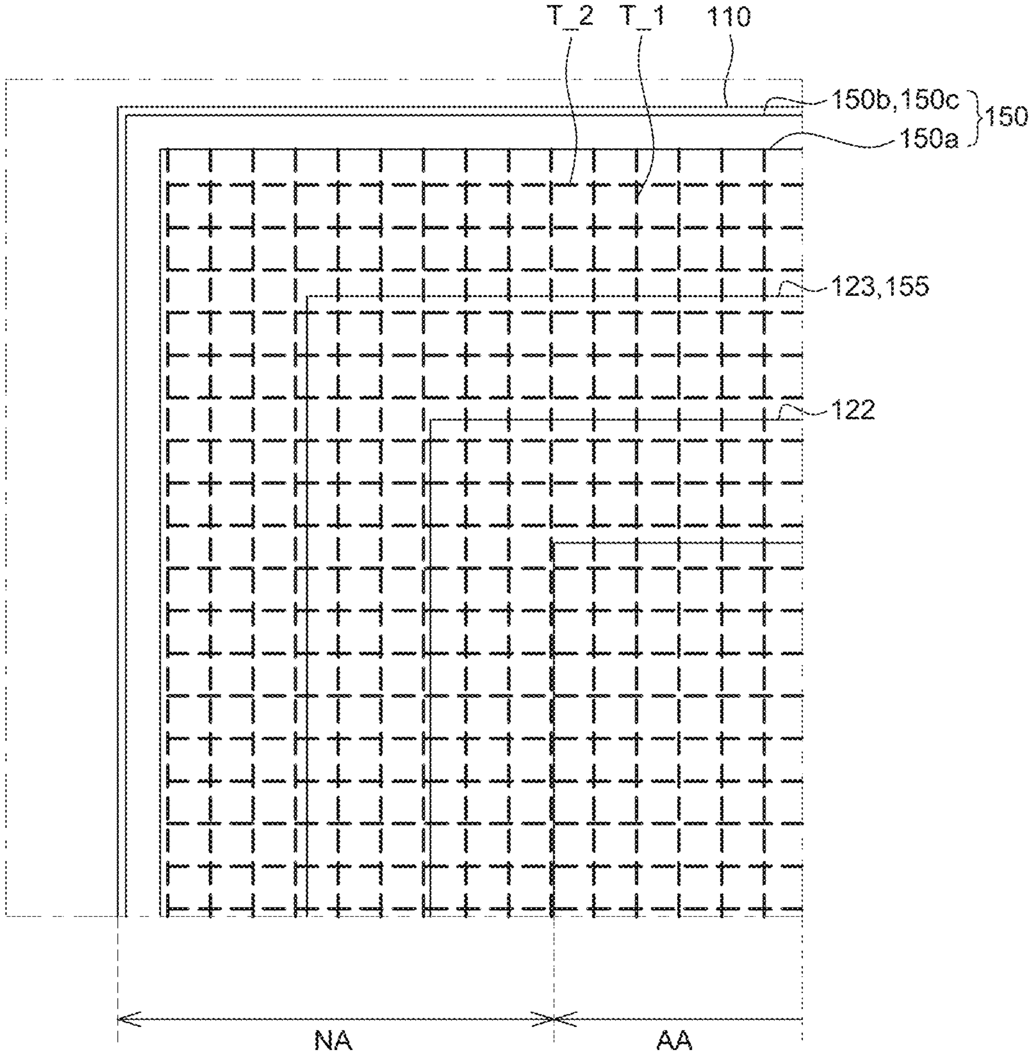
FIG. 11 is a plan view showing a part of a display panel according to a fourth exemplary embodiment of the present disclosure.

FIG. 11 is a plan view showing a part of a display panel according to a fourth exemplary embodiment of the present disclosure.

The display panel according to the fourth exemplary embodiment of the present disclosure as shown in FIG. 11 is substantially the same as the display panel according to the first exemplary embodiment as shown in FIG. 3A, FIG. 3B through FIG. 5 except that trenches T_1 and T_2 are disposed in a lattice pattern. Therefore, a repeated description thereof will be omitted. The same or like reference numerals denote the same or similar components.

As described above, for the convenience of description, FIG. 11 does not illustrate the other components except the encapsulation layer 150, the organic layer 122, the cathode 123, the buffer layer 155, and the trenches T_1 and T_2.

For the convenience of description, FIG. 11 arbitrarily illustrates the widths of the trenches T_1 and T_2 and the numbers of trenches T_1 and T_2. However, the present disclosure is not limited thereto.

Referring to FIG. 11, the display panel according to the fourth exemplary embodiment of the present disclosure may include the substrate 110, a light emitting diode, the encapsulation layer 150, and a plurality of trenches T_1 and T_2.

The encapsulation layer 150 according to the fourth exemplary embodiment of the present disclosure may include the organic film 150*b* and the secondary protection film 150*c* sequentially laminated on the primary protection film 150*a* in substantially the same manner as in the first exemplary embodiment. However, the present disclosure is not limited thereto.

Also, although not shown in the drawings, a protection film formed as a multilayer for encapsulation may be disposed on the entire surface of the substrate 110 including the secondary protection film 150*c*. Further, although not shown in the drawings, a transparent adhesive may be interposed between the encapsulation layer 150 and the protection film.

A polarization layer may be interposed between the protection film and the adhesive. However, the present disclosure is not limited thereto.

As described above, according to the present disclosure, the trenches T_1 and T_2 are formed in the surface of the primary protection film 150*a*.

The plurality of trenches T_1 and T_2 according to the fourth exemplary embodiment of the present disclosure may be disposed on the plane in a lattice pattern in both directions. For example, first trenches T_1 may be disposed parallel in the data line direction and second trenches T_2 may be disposed parallel in the gate line direction. However, the present disclosure is not limited thereto. A plurality of first trenches T_1 and a plurality of second trenches T_2 may be disposed to be inclined at a predetermined angle with respect to the data line direction or the gate line direction.

The trenches T_1 and T_2 may be formed throughout the entire active area.

The trenches T_1 and T_2 may be formed extending to a part of the non-active area. FIG. 11 illustrates an example where the trenches T_1 and T_2 are formed extending to the edge of the primary protection film 150*a*. However, the present disclosure is not limited thereto.

As described above, according to the present disclosure, the organic film 150*b* is conformally formed on the primary protection film 150*a* including the plurality of trenches T_1 and T_2 through a vapor deposition process.

The organic film 150*b* may be formed extending to a part of the non-active area.

The organic film 150*b* may be formed to cover the primary protection film 150*a*, but is not limited thereto.

Particularly, as described above, according to the fourth exemplary embodiment of the present disclosure, the organic film 150*b* is conformally formed on the primary protection film 150*a* including the plurality of trenches T_1 and T_2 along the inner contour shape of the trenches T_1 and T_2 through the iCVD process.

Also, according to the fourth exemplary embodiment of the present disclosure, the secondary protection film 150*c* formed by ALD is laminated on the organic film 150*b* formed by iCVD.

The secondary protection film 150*c* deposited on the organic film 150*b* has moisture barrier properties. Thus, it may protect the light emitting diode from moisture and oxygen.

The secondary protection film 150*c* may be conformally deposited with a smaller thickness than the organic film 150*b* along a surface shape of the organic film 150*b* through the ALD process.

The exemplary embodiments of the present disclosure can also be described as follows:

According to an aspect of the present disclosure, there is provided a display device. The display device comprises a substrate divided into an active area in which a plurality of sub-pixels is defined, and a non-active area, a light emitting diode disposed in each of the plurality of sub-pixels, a primary protection film disposed on the substrate on which the light emitting diodes are disposed, and including a plurality of trenches in its surface, an organic film deposited on the primary protection film along an inner contour shape of the trenches through a vapor deposition process and a secondary protection film disposed on the organic film.

The display device may further include a protection film disposed on the secondary protection film and an adhesive interposed between the secondary protection film and the protection film.

The display device may further include a touch electrode and/or a color filter layer disposed on the secondary protection film or the adhesive.

The display device may further include a planarization layer disposed on the substrate, wherein the plurality of light emitting diodes may be disposed on the planarization layer.

The display device may further include a bank disposed on the planarization layer, wherein the bank may extend to a part of the non-active area so as to cover a side surface of an edge of the planarization layer.

The display device may further include a buffer layer disposed on the bank, wherein the primary protection film may be disposed on the buffer layer.

The plurality of trenches may be disposed parallel in one direction.

The plurality of trenches may be disposed in a lattice pattern in one direction and a direction perpendicular to the one direction.

The primary protection film may be prepared as an inorganic film, and the trenches may be prepared in the surface of the primary protection film by dry-etching the inorganic film.

The trenches may be disposed throughout the entire active area, and the trenches may extend to a part of the non-active area.

The trenches may extend to an edge of the primary protection film.

The organic film may be conformally deposited on the primary protection film.

The organic film may be conformally deposited on the primary protection film through an initiated chemical vapor deposition (iCVD) process.

The organic film may be disposed extending to a part of the non-active area so as to cover the primary protection film.

The organic film may be deposited in an upturned U-shape on an upper surface of the primary protection film and deposited in a U-shape inside the trench.

The secondary protection film may be deposited on the organic film along a surface shape of the organic film through an atomic layer deposition (ALD) process.

The secondary protection film may be disposed extending to a part of the non-active area so as to cover the organic film.

The organic film may a primary organic film, and the display device may further include a secondary organic film deposited on the secondary protection film along an inner contour shape of the secondary protection film through a vapor deposition process and a tertiary protection film disposed on the secondary organic film.

The secondary organic film may be conformally deposited on the secondary protection film through an iCVD process, and the tertiary protection film may be deposited on the secondary organic film along a surface shape of the secondary organic film through an ALD process.

The primary protection film on a side surface of the trench may have a protrusion, and the protrusion may have a rectangular shape, a triangular shape or a trapezoidal shape in a cross-sectional view.

According to another aspect of the present disclosure, there is provided a display device. The display device comprises a substrate divided into an active area and a non-active area, a plurality of light emitting diodes disposed in the active area and an encapsulation layer including at least three films laminated on the substrate on which the light emitting diodes are disposed, wherein a lowermost layer of the encapsulation layer may include a plurality of trenches in its surface, and the plurality of trenches may extend to the non-active area via the active area.

The encapsulation layer may include an intermediate layer deposited on the lowermost layer along an inner contour shape of the trenches.

The intermediate layer may be conformally deposited on the lowermost layer through an iCVD process.

The encapsulation layer may include an upper layer deposited on the intermediate layer along a surface shape of the intermediate layer.

The upper layer may be conformally deposited on the intermediate layer through an ALD process.

According to still another aspect of the present disclosure, there is provided a display device. The display device comprises a substrate divided into an active area in which a plurality of sub-pixels is defined, and a non-active area, a light emitting diode disposed in each of the plurality of sub-pixels and a primary protection film including a plurality of trenches disposed in its surface over each of the light emitting diodes.

The display device may further include an organic film disposed on the primary protection film, an upper surface of the organic film having undulations conforming to the trenches.

The at least a portion of the upper surface of the organic film over the lowest surface of each individual trench may be lower than the uppermost surface of the primary protection film between the trenches.

The organic film may have greater thickness on the bottom surface of the trenches than on the walls of the trenches.

The display device may further include a secondary protection film disposed on the organic film.

The secondary protection film may be uniformly thick on surface of the organic film.

The thickness of the secondary protection film may be less than the thickness of the organic film.

The density of the secondary protection film may be greater than the density of the organic film.

The refractive index of the secondary protection film may be greater than the refractive index of the organic film.

The display device may further include a secondary organic film disposed on the secondary protection film and a tertiary protection film disposed on the secondary organic film.

A first trench of the plurality of trenches may be disposed in a first direction and a second trench of the plurality of trenches may be disposed in a second direction lying across the first direction.

The depth of each trench may be between 1 □m and 10 □m.

A ratio of the depth to the width of each trench may be between 0.3 and 3.0, optionally between 0.5 and 2.0, optionally between 0.75 and 1.3.

The cross-section of each of the trenches may have a trapezoidal shape.

At least one wall of each trench may form an acute angle with the plane of the substrate such that the at least one wall faces obliquely toward the substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate divided into an active area in which a plurality of sub-pixels are defined, and a non-active area;

a plurality of light emitting diodes in the plurality of sub-pixels;

a primary protection film on the substrate on which the plurality of light emitting diodes are disposed, the primary protection film including a plurality of trenches in a surface of the primary protection film;

an organic film on the primary protection film along an inner contour shape of the plurality of trenches through a vapor deposition process; and a secondary protection film on the organic film, wherein a lower surface of the secondary protection film includes a plurality of concave portions and convex portions corresponding to the plurality of trenches, and an upper surface of the secondary protection film includes a plurality of concave portions and convex portions aligned with the plurality of concave portions and convex portions of the lower surface, and wherein each of the plurality of concave portions of the upper surface of the secondary protection film is located within a corresponding one of the plurality of trenches recessed in the surface of the primary protection film.

2. The display device according to claim 1, further comprising:

a protection film on the secondary protection film; and an adhesive interposed between the secondary protection film and the protection film.

3. The display device according to claim 2, further comprising:

at least one of a touch electrode or a color filter layer on the secondary protection film or the adhesive.

4. The display device according to claim 1, further comprising:

a planarization layer on the substrate, wherein the plurality of light emitting diodes are on the planarization layer.

5. The display device according to claim 4, further comprising:

a bank disposed on the planarization layer, wherein the bank extends to a part of the non-active area so as to cover a side surface of an edge of the planarization layer.

6. The display device according to claim 5, further comprising:

a buffer layer on the bank, wherein the primary protection film is on the buffer layer.

7. The display device according to claim 1, wherein the plurality of trenches are disposed parallel in one direction.

8. The display device according to claim 7, wherein the plurality of trenches are disposed throughout an entirety of the active area, and the plurality of trenches extend to a part of the non-active area.

9. The display device according to claim 8, wherein the plurality of trenches extend to an edge of the primary protection film.

10. The display device according to claim 1, wherein the plurality of trenches are disposed in a lattice pattern in one direction and a direction perpendicular to the one direction.

11. The display device according to claim 1, wherein the primary protection film includes an inorganic film, and the plurality of trenches are prepared in a surface of the primary protection film by dry-etching the inorganic film.

12. The display device according to claim 1, wherein the organic film is conformally deposited on the primary protection film.

13. The display device according to claim 12, wherein the organic film is conformally deposited on the primary protection film through an initiated chemical vapor deposition (iCVD) process.

14. The display device according to claim 1, wherein the organic film extends to a part of the non-active area so as to cover the primary protection film.

15. The display device according to claim 1, wherein the organic film is deposited in an upturned U-shape on an upper surface of the primary protection film and deposited in a U-shape inside a trench among the plurality of trenches.

16. The display device according to claim 1, wherein the secondary protection film is deposited on the organic film along a surface shape of the organic film through an atomic layer deposition (ALD) process.

17. The display device according to claim 1, wherein the secondary protection film extends to a part of the non-active area so as to cover the organic film.

18. The display device according to claim 1, wherein the organic film is a primary organic film, and the display device further includes:

a secondary organic film deposited on the secondary protection film along an inner contour shape of the secondary protection film through a vapor deposition process; and a tertiary organic film on the secondary organic film.

19. The display device according to claim 18, wherein the secondary organic film is conformally deposited on the secondary protection film through an initiated chemical vapor deposition (iCVD) process, and the tertiary organic film is deposited on the secondary organic film along a surface shape of the secondary organic film through an atomic layer deposition (ALD) process.

20. The display device according to claim 1, wherein the primary protection film on a side surface of a trench of the plurality of trenches has a protrusion, and the protrusion has a rectangular shape, a triangular shape, or a trapezoidal shape in a cross-sectional view of the display device.

21. The display device according to claim 1, wherein a thickness of the secondary protection film is smaller than a thickness of the organic film.

22. A display device, comprising:

a substrate divided into an active area and a non-active area;

a plurality of light emitting diodes in the active area; and an encapsulation layer including at least three films laminated on the substrate on which the plurality of light emitting diodes are disposed, wherein a lowermost layer of the encapsulation layer includes a plurality of trenches in a surface of the lowermost layer of the encapsulation layer, and the plurality of trenches extend to the non-active area via the active area, wherein a lower surface of an upper layer of the encapsulation layer includes a plurality of concave portions and convex portions corresponding to the plurality of trenches, and an upper surface of the upper layer of the encapsulation layer includes a plurality of concave portions and convex portions aligned with the plurality of concave portions and convex portions of the lower surface, and wherein each of the plurality of concave portions of the upper surface of the upper layer of the encapsulation layer is located within a corresponding one of the plurality of trenches recessed in the surface of the lowermost layer of the encapsulation layer.

23. The display device according to claim 22, wherein the encapsulation layer includes an intermediate layer deposited on the lowermost layer along an inner contour shape of the plurality of trenches.

24. The display device according to claim 23, wherein the intermediate layer is conformally deposited on the lowermost layer through an initiated chemical vapor deposition (iCVD) process.

25. The display device according to claim 23, wherein a thickness of the upper layer of the encapsulation layer is smaller than a thickness of the intermediate layer of the encapsulation layer.

* * * * *